(12) United States Patent
Diegmann

(10) Patent No.: US 10,330,724 B2
(45) Date of Patent: Jun. 25, 2019

(54) MEASUREMENT ARRANGEMENT

(71) Applicant: Rohde & Schwarz GmbH & Co. KG, München (DE)

(72) Inventor: Philip Diegmann, München (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 296 days.

(21) Appl. No.: 15/135,818

(22) Filed: Apr. 22, 2016

(65) Prior Publication Data
US 2017/0307678 A1    Oct. 26, 2017

(51) Int. Cl.
*G01R 31/28* (2006.01)
*H04W 4/02* (2018.01)
*G01R 13/02* (2006.01)
*G01R 31/44* (2006.01)
*H04W 84/18* (2009.01)

(52) U.S. Cl.
CPC ..... *G01R 31/2808* (2013.01); *G01R 13/0218* (2013.01); *G01R 31/44* (2013.01); *H04W 4/02* (2013.01); *H04W 84/18* (2013.01)

(58) Field of Classification Search
CPC .... G01R 1/04; G01R 1/07328; G01R 31/043; G01R 31/2805; H05K 2201/09009
See application file for complete search history.

(56) References Cited

U.S. PATENT DOCUMENTS

| | | | |
|---|---|---|---|
| 4,631,473 A | 12/1986 | Honda | |
| 5,886,672 A | 3/1999 | Brune et al. | |
| 2004/0064750 A1* | 4/2004 | Conway | G01R 19/2516 713/401 |
| 2007/0038402 A1 | 2/2007 | Zhang | |
| 2007/0205886 A1 | 9/2007 | Huseth et al. | |
| 2009/0192736 A1 | 7/2009 | McCullough et al. | |
| 2009/0210177 A1 | 8/2009 | McCullough et al. | |
| 2009/0278849 A1 | 11/2009 | Williams | |
| 2011/0123187 A1 | 5/2011 | Bowern et al. | |
| 2011/0250928 A1 | 10/2011 | Schlub et al. | |

(Continued)

FOREIGN PATENT DOCUMENTS

| | | |
|---|---|---|
| DE | 10 2010 051213 A1 | 5/2012 |
| EP | 2 696 213 A2 | 2/2014 |

(Continued)

OTHER PUBLICATIONS

Non-Final Office Action for U.S. Appl. No. 15/064,594 (dated Oct. 6, 2017).

(Continued)

*Primary Examiner* — Tung X Nguyen
(74) *Attorney, Agent, or Firm* — Shumaker & Sieffert, P.A.

(57) ABSTRACT

A measurement arrangement and method for providing at least one combined measurement dataset, said measurement arrangement comprising at least one measurement device configured to generate measurement data in a measurement session, and a mobile device configured to generate measurement session context data of said measurement session, said measurement device and said mobile device being connected via at least one wireless link for data transfer, wherein the measurement data generated by said measurement device and associated measurement session context data generated by said mobile device are linked to provide a combined measurement dataset.

19 Claims, 4 Drawing Sheets

(56) References Cited

U.S. PATENT DOCUMENTS

| | | | |
|---|---|---|---|
| 2012/0042213 A1* | 2/2012 | Zimmerman | H04L 43/12 |
| | | | 714/46 |
| 2012/0056722 A1 | 3/2012 | Kawaguchi | |
| 2012/0306886 A1 | 12/2012 | Bernard et al. | |
| 2014/0036065 A1 | 2/2014 | Oakley et al. | |
| 2014/0194069 A1* | 7/2014 | Liu | H04W 24/00 |
| | | | 455/67.14 |
| 2015/0094104 A1 | 4/2015 | Wilmhoff et al. | |
| 2016/0323048 A1 | 11/2016 | Hisch | |

FOREIGN PATENT DOCUMENTS

| | | |
|---|---|---|
| EP | 2 778 627 A2 | 9/2014 |
| WO | WO 2013/020110 A2 | 2/2013 |
| WO | WO 2014/144948 A1 | 9/2014 |

OTHER PUBLICATIONS

European search Report for Patent Application No. 15165568.5 (dated Oct. 29, 2015).

* cited by examiner

MEASUREMENT ARRANGEMENT

FIELD OF THE INVENTION

The invention relates to a system comprising a measurement setup for providing at least one combined measurement dataset using a mobile device.

TECHNICAL BACKGROUND

Measurement devices such as oscilloscopes are widely used to measure signals of a device under test DUT. A device under test DUT can be an electronic circuitry comprising electronic components connected to each other via signal lines. In a conventional measurement arrangement, a measurement device derives probe signals from the device under test DUT at different test points wherein the signals can be displayed on a display unit of the measurement apparatus to an operator. Further, parameters of the measured signals such as frequency or amplitude can be displayed to the user. In this way, an operator can test whether the device under test DUT operates appropriately. In a conventional test environment, the operator has to create a measurement protocol of the performed measurement sequences performed at the device under test. For instance, the test operator has to document that he has tested the correct device under test by checking its unique serial production number and/or indicating the measurement test point where a test signal has been applied to a circuitry of the device under test DUT and where corresponding measurement signals have been measured. Moreover, the test operator has to document under which circumstances and/or environmental conditions the respective test sequence has been performed. The generation of these test protocols is very cumbersome and time-consuming. Moreover, these test protocols are prone to errors because the test operator may forget to document some relevant test issues or may perform errors when documenting circumstances of the performed test measurement. Moreover, since most measurement protocols are created manually it is impossible to automatically compare the plurality of measurement datasets taken from different devices under test DUT with each other and to perform an automatic analysis of the devices under test produced in a manufacturing facility for quality control.

Accordingly, there is a need for a method and apparatus providing an improved testing of electronic devices.

SUMMARY OF THE INVENTION

The invention provides according to a first aspect a measurement arrangement for providing at least one combined measurement dataset, said measurement arrangement comprising: at least one measurement device configured to generate measurement data in a measurement session and a mobile device configured to generate measurement session context data of said measurement session, said measurement device and said mobile device being connected via at least one wireless link for data transfer, wherein the measurement data generated by said measurement device and associated measurement session context data generated by said mobile device are linked to provide a combined measurement dataset.

In a possible embodiment of the measurement arrangement according to the first aspect of the present invention, said wireless link comprises at least one data channel for data transfer of data between said mobile device and said measurement device and at least one control channel for exchanging control signals between said mobile device and said measurement device.

In a further possible embodiment of the measurement arrangement according to the first aspect of the present invention, the provided combined measurement dataset is stored in a data memory of said measurement device and/or in a data memory of said mobile device for further processing by a data processing unit of the respective device or transported to a processing unit of a remote controller via a data network.

In a still further possible embodiment of the measurement arrangement according to the first aspect of the present invention, said mobile device comprises a data linking unit adapted to link automatically measurement session context data generated by said mobile device during a measurement session with measurement data transferred via said wireless link and received by a receiver of said mobile device from said measurement device to provide the combined measurement dataset.

In a still further possible embodiment of the measurement arrangement according to the first aspect of the present invention, the measurement device comprises a data linking unit adapted to link automatically measurement data generated by said measurement device during a measurement session with measurement session context data transferred via the wireless link and received by a receiver of said measurement device from said mobile device to provide the combined measurement dataset.

In a still further possible embodiment of the measurement arrangement according to the first aspect of the present invention, a data transfer between said measurement device and said mobile device via said wireless link is performed at data transfer time intervals outside measurement time intervals when measurements are performed by said measurement device in said measurement session to generate measurement data.

In a still further possible embodiment of the measurement arrangement according to the first aspect of the present invention, measurement data generated by the measurement device and measurement session context data generated by said mobile device are transferred via the wireless link using a data transfer signal having a frequency not interfering with measurement signals used by said measurement device during said measurement session.

In a still further possible embodiment of the measurement arrangement according to the first aspect of the present invention, the data transfer signal is an optical signal transported through an optical wireless link between said measurement device and said mobile device.

In a still further possible embodiment of the measurement arrangement according to the first aspect of the present invention, a remote controller is configured to control said mobile device and/or measurement device during said measurement session in a remote control operation modus.

In a still further possible embodiment of the measurement arrangement according to the first aspect of the present invention, the combined measurement dataset provided by a data linking unit of said mobile device or by a data linking unit of said measurement device is transported to said remote controller via a data network and stored in a remote database for further processing by a data processing unit of said remote controller.

In a still further possible embodiment of the measurement arrangement according to the first aspect of the present invention, a bidirectional communication channel between a first operator performing measurements of a device under test in a measurement session using said measurement device and a second test operator at the site of the remote controller is established by said mobile device switched to said remote control operation mode automatically during said measurement session.

In a possible embodiment of the measurement arrangement according to the first aspect of the present invention, the measurement device comprises an oscilloscope connected by means of a probe to a device under test to measure signals of the device under test during said measurement session.

In a possible embodiment of the measurement arrangement according to the first aspect of the present invention, said signals comprise high frequency signals of said device under test.

In a still further possible embodiment of the measurement arrangement according to the first aspect of the present invention, said measurement session context data generated by said mobile device comprises image data generated by a camera of said mobile device in the measurement session and/or acoustic data provided by a microphone of said mobile device in the measurement session and/or GPS data generated by a GPS receiver of said mobile device during the measurement session.

The invention further provides according to a second aspect a method for providing at least one combined measurement dataset comprising:

generating measurement data by a measurement device in a measurement session, generating measurement session context data by a mobile device in said measurement session and linking said measurement data and said measurement session context data by said measurement device or by said mobile device to provide a combined measurement dataset.

The invention further provides according to a third aspect a mobile device comprising a data linking unit adapted to link automatically measurement session context data generated by said mobile device during a measurement session with measurement data transferred via a wireless link and received by a receiver of said mobile device from a measurement device.

The invention further provides according to a fourth aspect a measurement device comprising a data linking unit adapted to link automatically measurement data generated y said measurement device during a measurement session with measurement session context data transferred via a wireless link and received by a receiver of said measurement device from a mobile device to provide the combined dataset.

The invention further provides according to a fifth aspect a system comprising a measurement setup for providing at least one combined measurement dataset, said measurement setup comprising at least one measurement device configured to generate measurement data in a measurement session and a mobile device configured to generate measurement session context data of said measurement session, said measurement device and said mobile device being connected via at least one wireless link for data transfer, wherein the measurement data generated by said measurement device and associated measurement session context data generated by said mobile device are linked to provide a combined measurement dataset, wherein a data processing unit is configured to process said combined measurement dataset.

In a possible embodiment of the system according to the fifth aspect of the present invention, the data processing unit is a remote data processing unit of a remote controller connected to said mobile device and/or to said measurement device through a data network.

BRIEF DESCRIPTION OF FIGURES

In the following, possible exemplary embodiments of the different aspects of the present invention are described in more detail with reference to the enclosed figures.

DETAILED DESCRIPTION OF EMBODIMENTS

Figure 1:
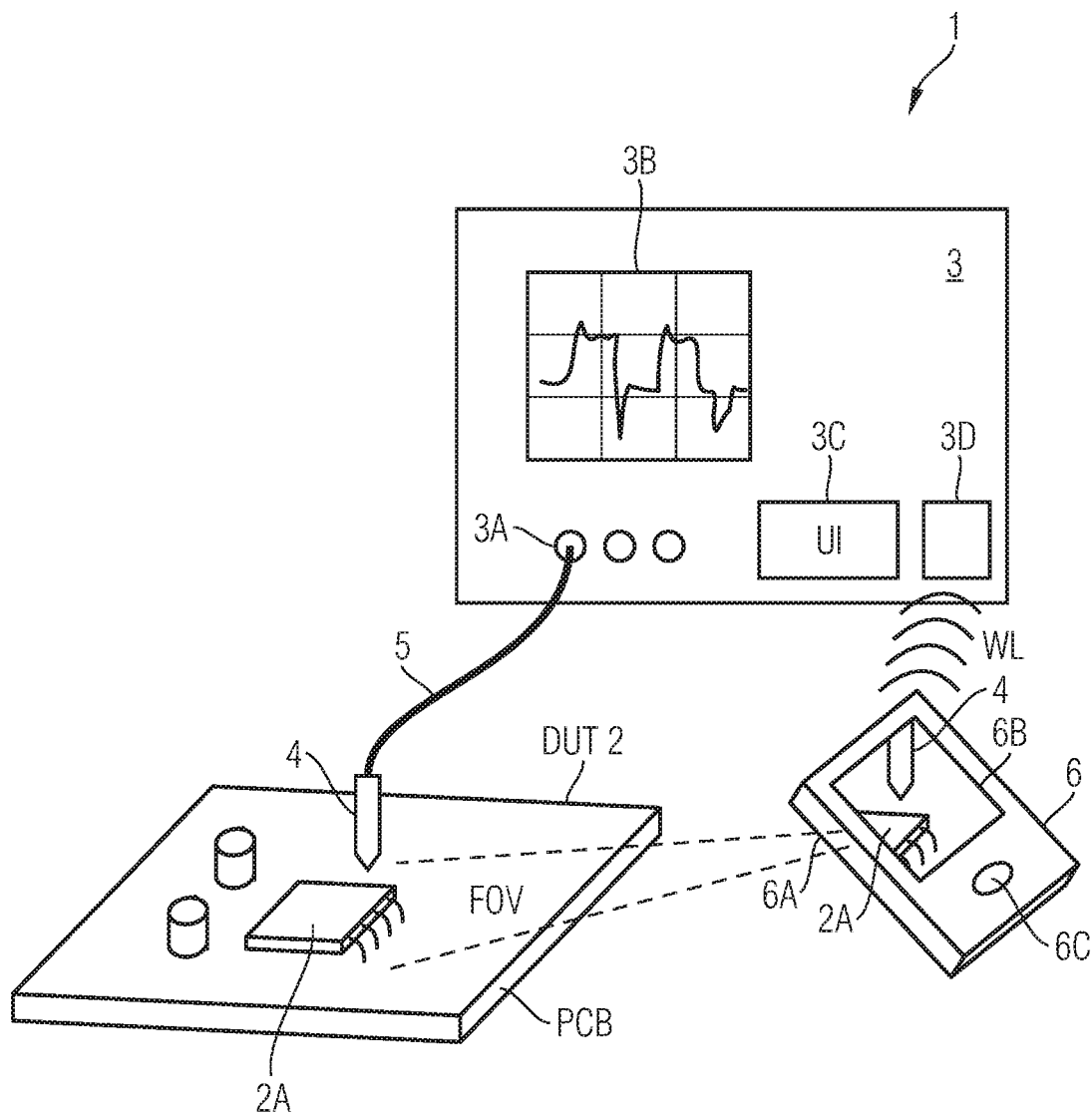
FIG. 1 shows a perspective view on a possible exemplary embodiment of a measurement, arrangement, according to the first aspect of the present invention.

FIG. 1 shows a schematic diagram to illustrate a possible exemplary embodiment of a measurement arrangement 1 according to a first aspect of the present invention. The measurement arrangement 1 is adapted to provide at least one combined measurement dataset for a device under test 2. The device under test 2 is in the illustrated exemplary embodiment a printed circuit board PCB comprising a plurality of electronic components. The electronic components can comprise discrete components such as coils or capacitors as well as integrated components such as microprocessors or ASICs. The printed circuit board PCB can form part of a more complex electronic apparatus or machine in the exemplary measurement arrangement 1 as shown in FIG. 1, the measurement arrangement comprises a measurement device 3 formed by an oscilloscope. The oscilloscope 3 is connectable by means of a probe signal cable 5 and a probe 4 to the device under test 2 to measure a signal of the device under test 2 during a measurement session. The probe signal cable 5 can be plugged into an input signal port 3A of the measurement device 3 as illustrated in FIG. 1. In the illustrated embodiment, the measurement device 3 comprises a display unit 3B adapted to display at least one measured probe signal taken from the device under test 2 during the measurement session. The measurement device 3 is configured to generate measurement data MD in a measurement session while the device under test 2 is tested by an operator. The measurement arrangement 1 as shown in FIG. 1 further comprises a mobile device C configured to generate measurement session context data MSCD during the measurement session. The mobile device 6 can be a portable handheld device, for instance a smartphone. The mobile device 6 can also be a portable laptop or a computer device. As illustrated in FIG. 1, the measurement device 3 and the mobile device 6 are connected during the measurement session via at least one wireless link WL for data transfer between the measurement device 3 and the mobile device 6. The measurement data MD generated by the measurement device 3 and associated measurement session context data MSCD generated by said mobile device 6 are linked automatically to provide a combined measurement dataset CMDS during the measurement session. The linking of the measurement session context data MSCD generated by the mobile device 6 during the measurement session with the measurement data MD generated by the measurement device 3 during the same measurement session is performed by a data linking unit. In a possible embodiment, the data linking is performed automatically by a data linking unit of the mobile device 6. In this embodiment, the mobile device 6 comprises a data linking unit adapted to link automatically measurement session context data MSCD generated by the mobile device 6 during the measurement session with measurement data MD transferred via the wireless link WL and received by a receiver of the mobile device 6 of the measurement device 3 to provide the combined measurement dataset CMDS.

In an alternative embodiment, the linking of the measurement session context data MSCD with the measurement data MD is performed by a data linking unit of the measurement device 3. In this embodiment, the measurement device 3 comprises a data linking unit adapted to link automatically measurement data MD generated by said measurement device during the measurement session with measurement session context data MSCD transferred via the wireless link WL, and received by a receiver of the measurement device 3 from the mobile device 6 to provide the combined measurement dataset CMDS.

The combined measurement dataset CMDS can be stored in a data memory of the measurement device 3 and/or in a data memory of the mobile device 6 for further processing by a data processing unit.

The measurement session context data MSCD is generated during the measurement session by the mobile device 6, for instance by a smartphone as illustrated in FIG. 1. The measurement session context data MSCD comprises in a possible implementation images generated by a camera of the mobile device 6 during the measurement session. As can be seen in FIG. 1, a camera of the mobile device 6 takes images of the device under test 2 during the measurement session within a field of view FoV of the camera in the measurement arrangement 1 shown in FIG. 1, the device under test 2, i.e. the printed circuit board PCB, comprises an integrated electronic component 2A such as a microcontroller having several signal pins connected to signal lines of the printed circuit board PCB. The electronic component 2A provides for instance an electric input or output signal measured by the probe 4 at one of its signal pins within the field of view FoV of the camera 6A of the mobile device 6. The image is displayed on a display unit 6B of the mobile device 6 when performing the measurement at the pins during the measurement session. The camera 6A of the mobile device 6 can take one or several pictures while performing the measurement, for instance in response to a control button 60 for activating the camera 6A.

The image data ImD generated by the camera 6A of the mobile device 6 during the measurement session form part of the measurement session context data MSCD generated by the mobile device 6. The measurement session context data MSCD can comprise in a possible embodiment additional data. In a possible embodiment, the measurement session context data MSCD can comprise acoustic data ACD provided by a microphone of said mobile device 6 during the measurement session. For instance, the operator may comment on the performed measurement during the measurement session by speaking into a microphone of the mobile device 6. Further, the acoustic data ACD may comprise sounds generated by the device under test 2 performing the measurement session. In a still further possible embodiment, the measurement session context data MSCD generated by the mobile device 6 can also comprise GPS data generated by a GPS receiver of the mobile device 6 during the measurement session. The GPS data can indicate the location where the measurement session has been performed. In a still further possible embodiment, the measurement session context data MSCD can also comprise identification data ID read from the device under test 2. For instance, the device under test 2 can comprise a readable RFID chip storing identification data of the device under test 2. The identification data may comprise for instance a serial number of the device under test 2 assigned to the device under test during manufacturing or fabrication of the device under test 2 and stored in a data memory of the readable RFID chip. The identification data ID is then automatically read by a reading unit of the mobile device 6 during the measurement session.

In a further possible embodiment, the mobile device 6 can be attached to the measurement device 3. In a possible implementation, when the attached mobile device 6 is taken by the operator from the measurement device 3, a measurement session application MSA is automatically activated. In an alternative implementation, a user or test operator can activate a measurement session application MSA in the mobile device 6 via a user interface of the mobile device 6. In a still further possible embodiment, the measurement session application MSA may be activated in response to a control signal received by the mobile device 6 from the measurement device 3. The measurement device 3 can also comprise a user interface 3C as illustrated in FIG. 1. In a possible implementation, the measurement session application program executed by the mobile device 6 is automatically activated in response to a user input of the user interface 3C of the measurement device 3.

In a possible embodiment, the wireless link WL between the measurement device 3 and the mobile device 6 comprises at least one data channel DCH for data transfer of data between the mobile device 6 and the measurement device 3 and at least one control channel CRTLCH by exchanging control signals between the mobile device 6 and the measurement device 3. In a preferred embodiment of the measurement arrangement 1 according to the first aspect of the present invention, the data transfer between the measurement device 3 and the mobile device 6 via the wireless link WL is performed at data transfer time intervals lying outside the measurement time intervals when measurements are physically performed by the measurement device 3 during the measurement session to generate the measurement data. This has the advantage that the data transfer cannot interfere with the performed measurements. Accordingly, the measurements performed at the device under test 2 are not disturbed by the data transfer between the measurement device 3 and the mobile device 6. In a further possible embodiment, the measurement data generated by the measurement device 3 and the measurement session context data MSCD generated by the mobile device 6 are transferred via the wireless link WL using a data transfer signal having a signal frequency not interfering with measurement signals used by the measurement device 3 during the measurement session. This also inhibits any disturbances of the measurement signals during the data transfer. In a still further possible implementation of the measurement arrangement 1 according to the first aspect of the present invention, the data transfer signal used for data transfer is an optical signal transported through an optical wireless link between the measurement device 3 and the mobile device 6.

The measurement data generated by the measurement device 2 and the associated measurement session context data MSCD generated by the mobile device 6 during the measurement session are linked automatically to provide a combined measurement dataset CMDS which can be stored in a data memory of the measurement, device 3 and/or in a data memory of the mobile device 6 for further processing. In a still further possible embodiment of the measurement arrangement 1, a combined measurement dataset CMDS can be further stored in a data memory of the device under test 2 itself in this embodiment, the generated combined measurement dataset CMDS is written back to a data memory of the device under test 2 for further processing. In a possible implementation, the automatically generated combined measurement dataset CMDS is written to a data memory of the device under test. 2 via a wireless link between the device under test 2 and the mobile device 6. In this embodiment, a combined measurement dataset CMDS comprising a plurality of information about the performed measurement session is stored back in the device under test. 2 and can be used later along the manufacturing production chain for further analysis and evaluation of the device under test 2. For instance, if a printed circuit board PCB as a device under test 2 is installed along with other printed circuit boards PCBs in a complex electronic apparatus, this apparatus may be tested during a final test sequence to see whether the electronic apparatus works appropriately. In case that the complex electronic apparatus has a production failure the different printed circuit boards 2 within the complex apparatus may be investigated to see which printed circuit board or device under test 2 is responsible for the malfunction of the complex apparatus. To final the error different measurement session protocols or combined measurement datasets CMDS generated automatically during the measurement sessions can be analyzed separately to find the root error having caused the malfunction. In a possible implementation, the combined measurement dataset CMDS stored in a data memory of the readable RFID chip of the printed circuit board PCB can be evaluated. The combined measurement dataset CMDS can comprise images generated by the camera 6A of the mobile device 6 during the measurement session. For instance, it can be investigated whether the measurement of a test signal during the measurement session was performed correctly by the operator. For instance, it can be investigated whether the probe 4 has been attached to the correct signal pin of the electronic component 2A of the printed circuit board PCB during the measurement session. In this way, it is possible to analyze why a potential error was not found during the production process of a complex electronic apparatus. In a further possible embodiment of the measurement arrangement 1 according to the first aspect of the present invention, the measurement session context data MSCD can comprise also identification data of the user or test person performing the measurement session or measurement sequence. In a possible implementation, the user may input this identity to a user interface of the mobile device 6. In an alternative implementation, the identity of the user may be registered automatically by a sensor of the mobile device 6, for instance a biometric sensor of the mobile device 6. In a possible implementation, the biometric sensor of the mobile device 6 may evaluate a fingerprint of the test operator handling the mobile device 6 and the measurement apparatus 3.

The measurement arrangement 1 as illustrated in FIG. 1 can be used during production of an electronic apparatus consisting of a plurality of devices under test DUT and/or electronic components or during maintenance or repairing of electronic components in a possible implementation, the device under test 2 can comprise a safety-critical device, for instance an electronic component used in an aircraft. During the measurement session, it may be measured whether the device under test 2 works correctly without any malfunctions in a still further possible embodiment, relevant data may be read from a data memory of the device under test 2 if the generated measurement session context data MSCD is used to prove that the measurement, i.e. reading of data, was performed without manipulation. For example, flight data recorded during flight of an aircraft can be read from the flight data recorder after an air crash within a measurement session to read out the recorded data. The associated measurement session context data MSCD linked to the measurement data or data flight record data can then later be used to prove that no data manipulation was performed during the measurement session. Accordingly, the measurement arrangement 1 according to the first aspect of the present invention can be used for any kind of forensic investigations performed at electronic circuits of complex electronic devices. Alternatively, the measurement arrangement 1 according to the first aspect of the present invention can also be used for investigating malfunctions of complex circuits and in particular to find why a possible malfunction was not observed in a measurement session when the device under test 2 of the electronic apparatus was tested.

In a still further possible embodiment of the measurement arrangement 1 according to the first aspect of the present invention, the combined measurement datasets CMDS of a plurality of similar devices under test 2 can be stored in a database for further processing. In a possible embodiment, the combined measurement datasets CMDS stored in the database can be compared automatically with each other, for instance to find error sources during a manufacturing process in a manufacturing facility. In a possible implementation, the image data generated during of the measurement session form part of the combined measurement dataset CMDS and can be extracted automatically from the combined measurement dataset CMDS to undergo an image data analyzing process. This image data analyzing process can receive as image input image data of a plurality of measurement session context datasets generated within a corresponding number of measurement sessions. The measurement arrangement 1 can be used for quality control within a production process where a plurality of devices under test 2 are produced.

Figure 2:
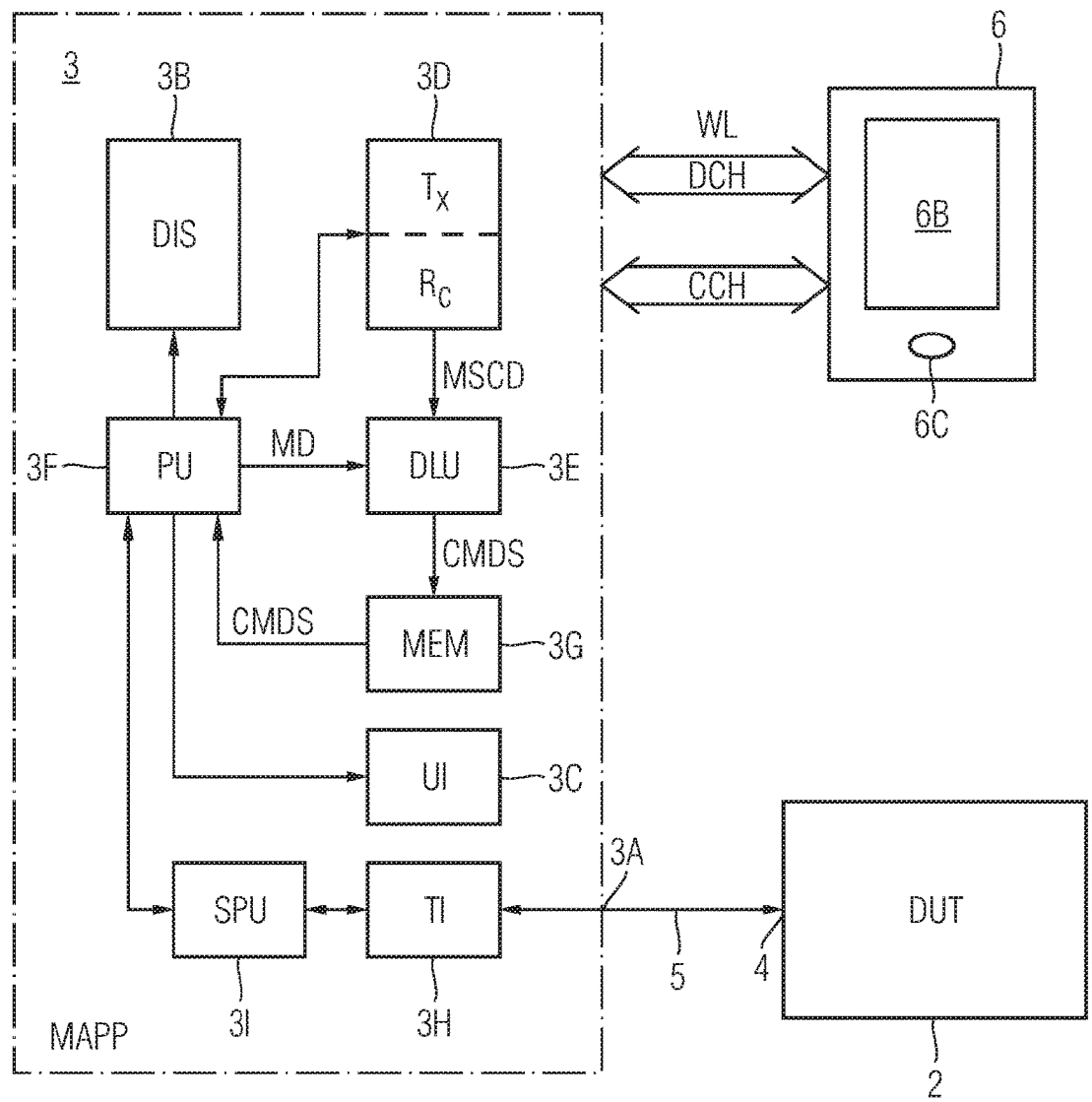
FIG. 2 shows a block diagram of a possible exemplary embodiment of a measurement arrangement, according to an aspect of the present invention.

FIG. 2 shows a block diagram for illustrating a possible exemplary embodiment of a measurement arrangement 1 according to the first aspect of the present invention. As can be seen in FIG. 2, the measurement device 3 is linked via a wireless link WL to a mobile device 6, for instance to a smartphone. The wireless link WL comprises at least one data channel DCH for data transfer of data between the mobile device 6 and the measurement device 3 and at least one control channel CCH for exchanging control signals CRTL between said mobile device 6 and said measurement device 3. The exchange of data and/or control signals can be performed according to a predetermined data exchange protocol. In the illustrated embodiment, the measurement device 3 comprises a transceiver 3D for bidirectional data exchange with the mobile device 6. The transceiver 3D is connected to a data linking unit 3E of the measurement device 3. The measurement apparatus 3 can be in a possible embodiment an electronic oscilloscope having at least one signal input port 3A for connecting the measurement device 3 via a signal line 5 to a probe 4 attached to a test signal point of the device under test 2. The data linking unit 3E or the measurement device 3 is adapted to link automatically measurement data MD generated by a processing unit 3F or the measurement device 3 during a measurement session with measurement session context data MSCD transferred via the wireless link WL received by the transceiver 3D of the measurement device 3 from said mobile device 6 to provide the combined measurement dataset CMDS. The data linking unit 3E of the measurement device 3 generates a combined measurement dataset CMDS which can be stored in a data memory 3G of the measurement device 3. The combined measurement dataset CMDS stored in the memory 3G can be supplied to the processing unit 3F of the measurement apparatus 3 for further processing.

The test probe signal taken from the device under test 2 during a measurement session is supplied via an input 3A to a test signal input unit 3H of the measurement device 3 and preprocessed by a signal processing unit 3I of the measurement device 3. The signal processing unit 3I is adapted to process the measured analog signal and to provide the processing unit 3F with measurement data of the device under test 2 generated during the measurement session. This measurement data MD can be supplied by the processing unit 3F to the data linking unit 3E. In a possible implementation, the data linking unit 3E is integrated in the processing unit 3F of the measurement device 3. Further, the measurement data can be displayed on the display unit 3B of the measurement device 3. In a possible implementation, the combined measurement dataset. CMDS stored temporarily in the data memory 3G of the measurement device 3 can be output via a data interface to an external memory for further processing. In a still further possible embodiment, the combined measurement dataset CMDS can also be written to a local data memory of the device under test 2 for further data processing. Further, the combined measurement dataset CMDS stored in the data memory 3G can be transferred via a data channel DCH of the wireless link WL, to a local data memory of the mobile device 6 for further processing.

Figure 3:
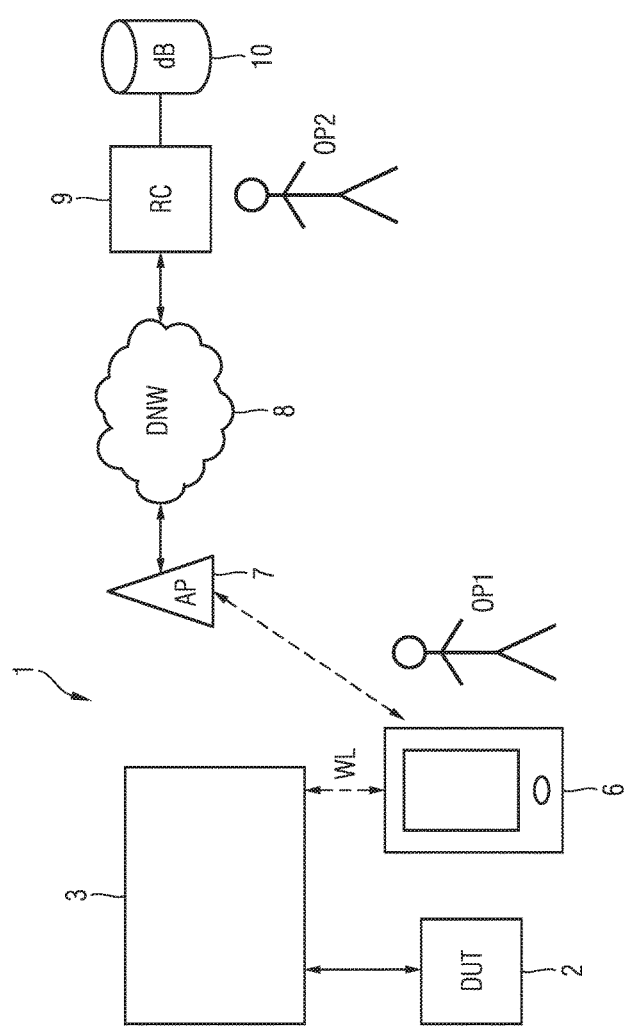
FIG. 3 shows a further block diagram for illustrating a further possible exemplary embodiment of a measurement arrangement according to the first aspect of the present invention.

FIG. 3 shows a further possible embodiment of a measurement arrangement 1 according to the present invention. In the illustrated embodiment, the mobile device 6 is connected via a further wireless link to an access point 7 of a communication network. The communication network can be for instance a telephone network. The access point 7 is connected via a data network 8 to a remote controller 9 having access to a database 10. A first test operator OP1 performs measurements on the device under test. 2 in a measurement session using the measurement device 3. The operator OP1 performs the measurements at the site of the device under test 2. A second test operator OP2 works at the location of the remote controller 9 as illustrated in FIG. 3. In a possible embodiment, a bidirectional communication channel between the first operator OP1 performing measurements at the device under test 2 during a measurement session using the measurement apparatus 3 and the second test operator OP2 working at the location of the remote controller 9 is established automatically by the mobile device 6, if the mobile device 6 is switched by the first operator OP1 to a remote control operation mode during the measurement session. In the remote control operation mode, the remote controller 9 is configured to control the mobile device 6 and/or the measurement device 3 during the measurement session. In the measurement arrangement 1 as shown in FIG. 3, the first operator OP1 does not have to be as qualified as the second test operator OP2. The first operator OP1 may be a less trained operator performing the measurement session under the supervision of the second test operator OP2 working at the location of the remote controller 9. In a possible embodiment, the second operator OP2 receives during the measurement session measurement session context data MSCD generated by the mobile device 6 including image data, acoustic data and/or GPS data. The second operator OP2 can give a feedback and/or instructions to the first operator OP1 performing the measurement session at the location of the device under test 2 during the measurement session. In this way, the second operator OP2 can assist the first operator OP1 at the location of the device under test 2 during the measurement session to improve the quality of the performed test. In a possible embodiment, the generated combined measurement dataset MSCD is supplied via the data network 8 to the remote controller 9 for further processing and can be stored in the database 10 of the measurement system.

The measurement arrangement 1 according to the present invention can be used to perform measurements of the device under test 2 to measure signals of the device under test 2 during the measurement session. The signals can comprise high frequency signals, in particular signals having a frequency of more than 1 MHz. Data transfer between the measurement device 3 and the mobile device 6 via the wireless link is performed in a preferred embodiment at data transfer time intervals outside the measurement time intervals when measurements are performed by the measurement device 3 during the measurement session. In this way, negative impacts of the data transfer on the measured high frequency signals can be avoided. In a further possible implementation, the data transfer signal comprises an optical signal transported through an optical wireless link between the measurement device 3 and the mobile device 6.

Figure 4:
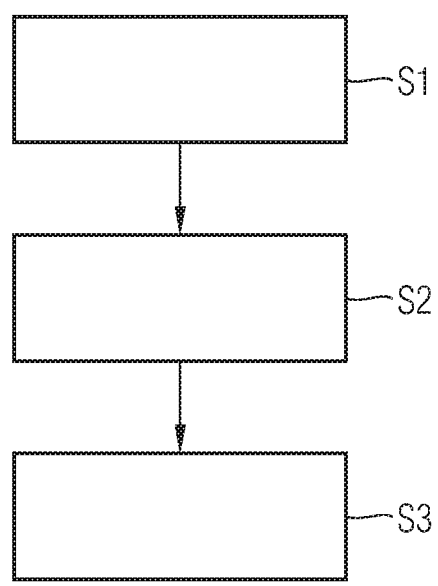
FIG. 4 shows a flowchart for illustrating a possible exemplary embodiment of a method for providing at least one combined measurement dataset according to a further aspect of the present invention.

FIG. 4 shows a flowchart of a possible exemplary embodiment of a method for providing at least one combined measurement dataset according to a further aspect of the present invention.

In a first step S1, measurement data is generated by a measurement device in a measurement session. The measurement device can be for instance an oscilloscope adapted to measure high frequency signals with a frequency of more than 1 MHz.

In a further step S2, measurement session context data MSCD is generated by a mobile device 6 during the measurement session. The mobile device 6 can be for instance a smartphone handled by a test operator.

In a further step S3, measurement data and the measurement session context data are linked by a data linking unit of the measurement device or by a data linking unit of the mobile device to provide the combined measurement dataset CMDS. The combined measurement dataset CMDS can be stored in a data memory for further processing.

The combined measurement dataset CMDS can be evaluated in a data analyzing process. Depending on the result of the data analyzing process, a possible production failure within a production facility can be found and the production process can be improved. The generated combined measurement dataset CMDS can be used to monitor the production and/or maintenance process for a device under test 2. The combined measurement dataset generated by the method according to the present invention as illustrated in the flowchart of FIG. 4 can further be used for investigations performed at electronic circuitry, in particular for safety-critical electronic circuits.

The method for providing at least one combined measurement dataset CMDS can be performed by program executed by a program execution unit. The execution unit can be implemented in a possible embodiment in the measurement device 3 in an alternative embodiment, the execution unit can be implemented in the mobile device 6 of a user in a still further possible embodiment, the execution unit can be implemented in a remote controller 9 of a measurement system as illustrated in FIG. 3.

The measurement session context data MSCD can comprise a variety of different data including image data, acoustic data, GPS data, user identification data and/or identification data of the device under test 2. The measurement session context MSCD data can further comprise in a possible implementation additional data such as timestamp data or data indicating environmental conditions during the measurement session. The measurement session context data can further comprise project data or any other kind of data related to the device under test 2.

The wireless WL between the measurement device 2 and the mobile device 6 can comprise in a possible implementation a WLAN link, a Bluetooth link, a ZigBee link and/or a Near Field Communication NFC link. In a possible embodiment, the operator can control the measurement session by a voice control via a microphone of the mobile device 6. With the method and the measurement arrangement 1 according to the present invention, a test measurement protocol can be generated automatically for further processing. The method for providing at least one combined measurement dataset CMDS according to an aspect of the present invention can be formed by an application program run on a client's device such as the mobile device 6 and/or run by a server device run for instance on a remote controller 9 as illustrated in FIG. 3. The measurement arrangement 1 according to the present invention comprises in a possible implementation a remote maintenance of a device under test 2 or of a complex apparatus consisting of different devices under test 2.

The invention claimed is:

1. A measurement arrangement for providing at least one combined measurement dataset CMDS,
said measurement arrangement comprising:
at least one measurement device configured to generate measurement data, MD, in a measurement session, performed by a test operator,
wherein the measurement data, MD, is generated while performing a measurement of a device under test, DUT, by a probe connected by a signal line to an input signal port of said measurement device and attached to a test signal point of the device under test, DUT, within a field of view, FoV, of a camera of a mobile device handled by the test operator and configured to generate measurement session context data, MSCD, of said measurement session,
wherein the measurement session context data, MSCD, comprises images of the device under test, DUT, taken by the camera of said mobile device during the measurement session within the field of view, FoV, of said camera
wherein said measurement device and said mobile device are connected via at least one wireless link for data transfer,
wherein the measurement data, MD, generated by said measurement device and associated measurement session context data, MSCD, generated by said mobile device are linked by a data linking unit to provide a combined measurement dataset, CMDS, evaluated to investigate whether the measurement of the device under test, DUT, was performed correctly by the test operator.

2. The measurement arrangement according to claim 1, wherein said wireless link comprises at least one data channel for data transfer of data between said mobile device and said measurement device and at least one control channel for exchanging control signals between said mobile device and said measurement device.

3. The measurement arrangement according to claim 1, wherein the provided combined measurement dataset, CMDS, is stored in a data memory of said measurement device and/or in a data memory of said mobile device for further processing by a data processing unit of the respective device or transported to a processing unit of a remote controller via a data network.

4. The measurement arrangement according to claim 1, wherein said mobile device comprises the data linking unit adapted to link automatically measurement session context data, MSCD, generated by said mobile device during the measurement session with the measurement data, MD, transferred via said wireless link and received by a receiver of said mobile device from said measurement device to provide the combined measurement dataset, CMDS.

5. The measurement arrangement according to claim 1, wherein said measurement device comprises the data linking unit adapted to link automatically the measurement data, MD, generated by said measurement device during the measurement session with measurement session context data, MSCD, transferred via said wireless link and received by a receiver of said measurement device from said mobile device to provide the combined measurement dataset, CMDS.

6. The measurement arrangement according to claim 1, wherein a data transfer between said measurement device and said mobile device via said wireless link is performed at data transfer time intervals outside measurement time intervals when measurements are performed by said measurement device in said measurement session to generate the measurement, data MD.

7. The measurement arrangement according to claim 1, wherein the measurement data, MD, generated by said measurement device and measurement session context data, MSCD, generated by said mobile device are transferred via said wireless link using a data transfer signal having a frequency not interfering with measurement signals used by said measurement device during said measurement session.

8. The measurement arrangement according to claim 7, wherein said data transfer signal is an optical signal transported through an optical wireless link between said measurement device and said mobile device.

9. The measurement arrangement according to claim 1, wherein a remote controller is configured to control said mobile device and/or said measurement device during said measurement session in a remote control operation mode.

10. The measurement arrangement according to claim 9, wherein the combined measurement dataset, CMDS, provided by the data linking unit of said mobile device and/or by the data linking unit of said measurement device is transported to said remote controller via a data network and stored in a remote database for further processing by a data processing unit of said remote controller.

11. The measurement arrangement according to claim 9, wherein a bidirectional communication channel between a first operator performing measurements of said device under test, DUT, in the measurement session using said measurement device and a second test operator at the site of the remote controller is established by said mobile device switched to said remote control operation mode automatically during said measurement session.

12. The measurement arrangement according to claim 1, wherein said measurement device comprises an oscilloscope connected by means of the probe to said device under test, DUT, to measure signals of said device under test, DUT, during said measurement session.

13. The measurement arrangement according to claim 12, wherein said signals comprise high frequency signals of said device under test, DUT.

14. The measurement arrangement according to claim 1, wherein said measurement session context data, MSCD, generated by said mobile device further comprises:
   acoustic data provided by a microphone of said mobile device in the measurement session including spoken comments of the test operator and/or sounds generated by the device under test, DUT, and/or
   GPS data generated by a GPS receiver of said mobile device during the measurement session, and/or
   identification data read from an RFID chip of the device under test, DUT, and/or
   identification data of the test operator performing the measurement session and/or time stamp data, and/or
   data indicating environmental conditions during the measurement session.

15. A method for providing at least one combined measurement dataset, CMDS, comprising:
   (a) generating measurement data, MD, by a measurement device in a measurement session performed by a test operator, wherein the measurement data, MD, is generated while performing a measurement of a device under test, DUT, by a probe connected by a signal line to an input signal port of said measurement device and attached to a test signal point of the device under test, DUT, within a field of view, FoV, of a mobile device handled by the test operator;
   (b) generating measurement session context data by the mobile device in said measurement session, wherein the measurement session context data, MSCD, comprises images of the device under test, DUT, taken by the camera of said mobile device during the measurement session within the field of view, FoV, of said camera;
   (c) linking said measurement data, MD, and said measurement session context data MSCD, by a data linking unit of said measurement device or of said mobile device to provide a combined measurement dataset, CMDS; and
   (d) evaluating the combined measurement dataset, CMDS, to investigate whether the measurement of the device under test, DUT, was performed correctly by the test operator.

16. A mobile device comprising
a data linking unit adapted to link automatically measurement session context data, MSCD, generated by said mobile device during a measurement session performed by a test operator with measurement data, MD, transferred via a wireless link and received by a receiver of said mobile device from the measurement device to provide a combined measurement dataset, CMDS, wherein the measurement data, MD, is generated while performing the measurement of a device under test, DUT, by a probe connected by a signal line to an input signal port of said measurement device and attached to a test signal point of the device under test, DUT, within a field of view, FoV, of a camera of the mobile device,
wherein the combined measurement dataset, CMDS, is evaluated to investigate whether the measurement of the device under test, DUT, was performed correctly by the test operator, and wherein the measurement session context data, MSCD, generated by said mobile device during the measurement session comprises images of the device under test, DUT, taken by the camera of the mobile device during the measurement session within the field of view, FoV, of said camera.

17. A measurement device comprising
a data linking unit adapted to link automatically measurement data, MD, generated by said measurement device during a measurement session performed by a test operator, wherein the measurement data, MD, is generated by performing a measurement of a device under test, DUT, by a probe connected by a signal line to an input signal port of said measurement device and attached to a test signal point of the device under test, DUT, within a field of view, FoV, of a camera of a mobile device handheld by the test operator and configured to generate measurement session context data, MSCD, of said measurement session, wherein the measurement session context data, MSCD, comprises images of the device under test, DUT, taken by the camera of said mobile device during the measurement session within the field of view, FoV, of said camera,
wherein the measurement session context data, MSCD, is transferred via a wireless link and received by a receiver of said measurement device from said mobile device to provide a combined measurement dataset, CMDS, evaluated to investigate whether the measurement of the device under test, DUT, was performed correctly by the test operator.

18. A system comprising a measurement setup for providing at least one combined measurement dataset, CMDS, said measurement setup comprising:
   at least one measurement device configured to generate measurement data, MD, in a measurement session performed by a test operator, wherein the measurement data, MD, is generated while performing a measurement of a device under test, DUT, by a probe connected by a signal line to an input signal port of said measurement device and attached to a test signal point of the device under test, DUT, within a field of view, FoV, of a camera of a mobile device handled by the test operator and configured to generate measurement session context data, MSCD, of said measurement session,
   wherein the measurement session context data, MSCD, comprises images of the device under test, DUT, taken by the camera of said mobile device during the measurement session within the field of view, FoV, of said camera, wherein said measurement device and the mobile device are connected via at least one wireless link for data transfer,
   wherein the measurement data, MD, generated by said measurement device and associated measurement session context data, MSCD, generated by said mobile device are linked by a data linking unit of said mobile device or of said measurement device to provide a combined measurement dataset, CMDS, and
   wherein a data processing unit is configured to process the combined measurement dataset, CMDS, evaluated to investigate whether the measurement of the device under test, DUT, was performed correctly by the test operator.

19. The system according to claim 18, wherein said data processing unit is a remote data processing unit of a remote controller connected to said mobile device and/or to said measurement device through a data network.

\* \* \* \* \*